United States Patent
Yamada

(10) Patent No.: US 12,282,057 B2
(45) Date of Patent: Apr. 22, 2025

(54) ELECTRONIC COMPONENT HANDLING APPARATUS AND ELECTRONIC COMPONENT TESTING APPARATUS

(71) Applicant: ADVANTEST Corporation, Tokyo (JP)

(72) Inventor: Yuya Yamada, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 67 days.

(21) Appl. No.: 18/085,794

(22) Filed: Dec. 21, 2022

(65) Prior Publication Data
US 2023/0305053 A1    Sep. 28, 2023

(30) Foreign Application Priority Data

Feb. 9, 2022   (JP) .................. 2022-018594

(51) Int. Cl.
*G01R 31/28* (2006.01)
*G01R 1/04* (2006.01)

(52) U.S. Cl.
CPC ....... *G01R 31/2875* (2013.01); *G01R 1/0458* (2013.01); *G01R 31/2863* (2013.01); *G01R 31/2877* (2013.01)

(58) Field of Classification Search
CPC .............. G01R 31/2875; G01R 1/0458; G01R 31/2863; G01R 31/2877; G01R 31/2874; G01R 31/2867; G01R 31/2891; G01R 31/2887; G01R 31/2889; F25D 31/005; H05B 3/286
See application file for complete search history.

(56) References Cited

U.S. PATENT DOCUMENTS

| | | | |
|---|---|---|---|
| 2009/0161286 A1* | 6/2009 | Steger | H01L 21/6831 361/234 |
| 2009/0302878 A1* | 12/2009 | Sherry | H01L 24/13 324/755.05 |
| 2010/0239155 A1 | 9/2010 | Ichikawa et al. | |

(Continued)

FOREIGN PATENT DOCUMENTS

| | | |
|---|---|---|
| JP | 2001-135684 A | 5/2001 |
| JP | 2002-64133 A | 2/2002 |

(Continued)

OTHER PUBLICATIONS

Office Action issued in corresponding Korean Patent Application No. 10-2022-0176657, dated Jun. 3, 2024 (13 pages).

(Continued)

*Primary Examiner* — Akm Zakaria
(74) *Attorney, Agent, or Firm* — Osha Bergman Watanabe & Burton LLP

(57) ABSTRACT

An electronic component handling apparatus that handles a DUT or a carrier accommodating the DUT, including: a pressing device that: electrically connects the DUT to a socket by pressing the DUT or the carrier toward the socket, and includes: a temperature control device that: controls a temperature of the DUT, and includes: a heater unit that is a heat source, the heater unit including: a flat heater; a first heat transfer material disposed on a first main surface of the flat heater; and a second heat transfer material disposed on a second main surface of the flat heater.

16 Claims, 9 Drawing Sheets

(56) References Cited

U.S. PATENT DOCUMENTS

| | | | | |
|---|---|---|---|---|
| 2018/0007780 A1* | 1/2018 | Takebayashi | .......... | H05K 1/113 |
| 2020/0371155 A1* | 11/2020 | Walczyk | ............ | G01R 31/2863 |
| 2021/0105911 A1* | 4/2021 | Yang | .................. | H05K 7/20509 |
| 2022/0264704 A1* | 8/2022 | He | ......................... | H05B 3/286 |
| 2023/0337406 A1* | 10/2023 | Bawa | .................. | H05K 7/2099 |

FOREIGN PATENT DOCUMENTS

| | | | | |
|---|---|---|---|---|
| KR | 10-2016-0086707 A | | | 7/2016 |
| KR | 10-2018-0046120 A | | | 5/2018 |
| TW | 200629457 A | | | 8/2006 |
| TW | 200721343 A | | | 6/2007 |
| TW | 201346293 A | * | | 11/2013 |
| WO | 2009057203 A1 | | | 5/2009 |

OTHER PUBLICATIONS

Office Action issued in Taiwanese Application No. 11220967360; Dated Sep. 26, 2023 (6 pages).
Decision of Refusal issued in corresponding Taiwanese Application No. 111146937 mailed Jul. 31, 2024 (5 pages).

\* cited by examiner

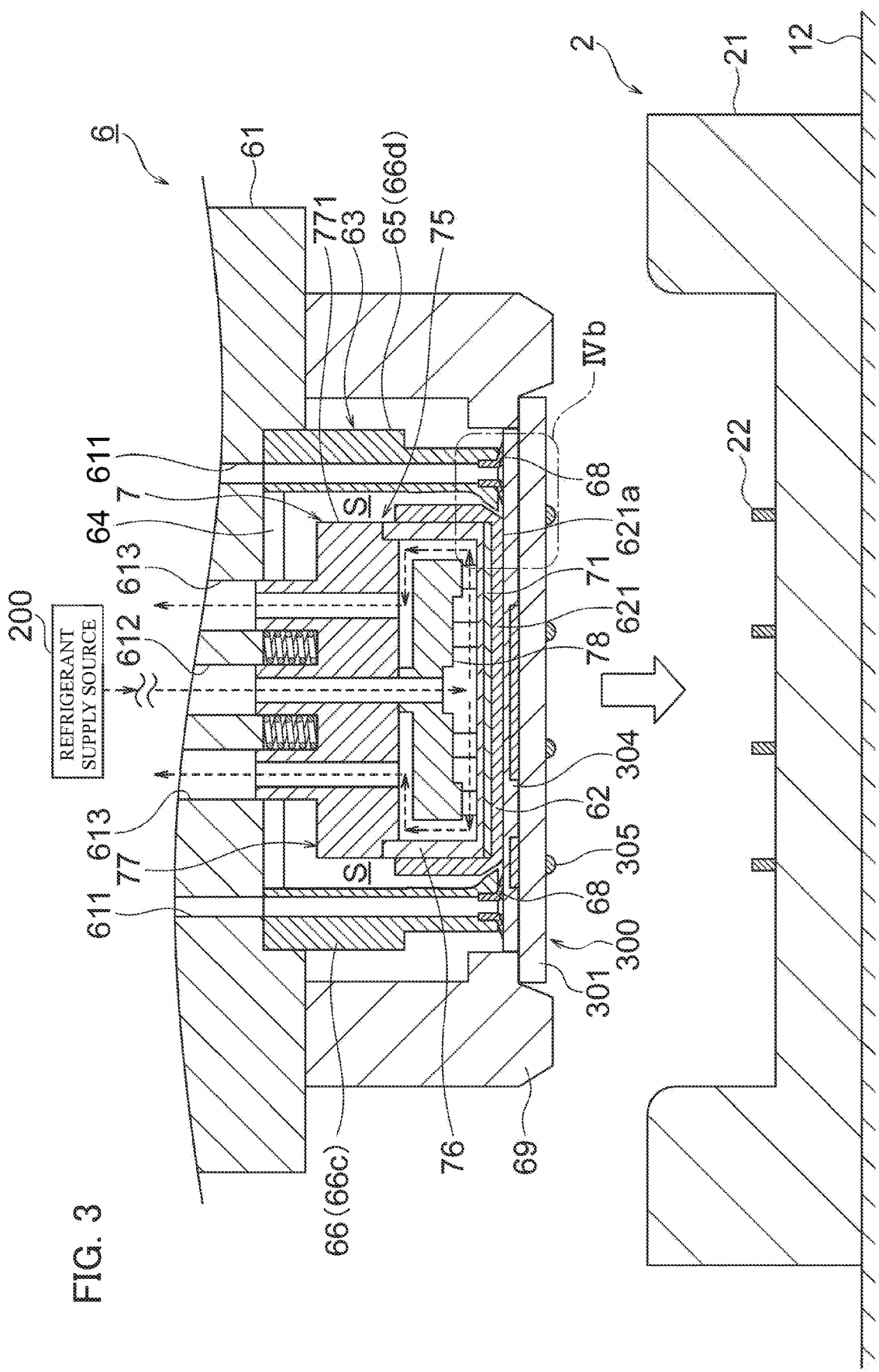

ELECTRONIC COMPONENT HANDLING APPARATUS AND ELECTRONIC COMPONENT TESTING APPARATUS

CROSS-REFERENCE TO RELATED APPLICATIONS

The present application claims priority from Japanese Patent Application No. 2022-018594 filed on Feb. 2, 2022, the contents of which are incorporated herein by reference in their entirety.

BACKGROUND

Technical Field

The present invention relates to an electronic component handling apparatus and an electronic component testing apparatus used for testing of an electronic device under test (hereinafter, referred to as a "device under test (DUT)") such as a semiconductor integrated circuit device.

Description of Related Art

An electronic component testing apparatus comprises a handler for transporting a DUT (e.g., see Patent Document 1). This handler sucks and holds the DUT by a contact arm and presses the DUT against a socket of a test head. The lower portion of the contact arm of such handler comprises a pusher for pressing the DUT to the socket, a heater for controlling temperature of the DUT is disposed inside the pusher.

PATENT DOCUMENT

PATENT DOCUMENT 1: WO 2009/057203 A1

As the above heater in the electronic component testing apparatus, a ceramic heater having a built-in heating element in the ceramic is generally used. However, the ceramic heater has a large heat capacity because a mass is large, the temperature rise rate of the ceramic heater becomes slow. Therefore, in the temperature control using the ceramic heater, the responsiveness is deteriorated.

Furthermore, in the ceramic heater, when the heating element generates heat rapidly, a portion of the ceramic is distorted by local thermal expansion and the ceramic heater is damaged.

SUMMARY

One or more embodiments of the present invention provide an electronic component handling apparatus and an electronic component testing apparatus capable of improving the response and preventing damage to the heater.

[1] An electronic component handling apparatus according to one or more embodiments of the present invention handles a DUT or a carrier accommodating the DUT. The electronic component handling apparatus comprises a pressing device that electrically connects the DUT to the socket by pressing the DUT or the carrier toward the socket, the pressing device comprises a temperature control device that controls temperature of the DUT, the temperature control device comprises a heater unit that is a heat source, the heater unit comprises: a flat heater; a first heat transfer material that is disposed on a first main surface that is one main surfaces of the flat heater; and a second heat transfer material that is disposed on a second main surface that is another main surface of the flat heater.

[2] In one or more embodiments, the first and second heat transfer material may preferentially diffuse heat from the flat heater in a first direction parallel to the first and second main surfaces of the flat heater.

[3] In one or more embodiments, the first and second heat transfer material may be graphite sheets.

[4] In one or more embodiments, the heater unit may be a sheet-like laminate having a thickness of 400 μm or less.

[5] In one or more embodiments, the flat heater may comprises: a first resin layer; a second resin layer laminated on the first resin layer; and a metal wire layer sandwiched between the first and second resin layers.

[6] In one or more embodiments, the flat heater may be a polyimide heater.

[7] In one or more embodiments, the temperature control device may further comprise a cooling unit that is a cooling source and contacts the heater unit, and the cooling unit may comprise a flow path in which a refrigerant flows.

[8] In one or more embodiments, the pressing device may further comprise a biasing mechanism (i.e., an elastic body) that biases the cooling unit toward the heater unit, and the cooling unit may press the heater unit by being biased by the biasing mechanism.

[9] In one or more embodiments, the pressing device may further comprise a contact plate that contacts the DUT or the carrier, the cooling unit may press the heater unit by being biased by the biasing mechanism, and the heater unit may contact the contact plate by being pressed with the cooling unit.

[10] In one or more embodiments, the cooling unit may comprise: a nozzle body that has an injection port injecting the refrigerant; and a cold plate that is arranged to face the injection port and be separated from the injection port and to which the refrigerant is injected from the nozzle body, the flow path may comprise an air gap formed between the nozzle body and the cold plate, and the refrigerant injected from the nozzle body may flow in the air gap after arriving the cold plate.

[11] In one or more embodiments, the cold plate may comprise a first facing surface that faces the nozzle body, the nozzle body may comprise a second facing surface that faces the cold plate, the air gap may be formed between the first facing surface and the second facing surface, and the first and second facing surfaces may be flat surfaces.

[12] In one or more embodiments, the injection port may be formed substantially at a center of the second facing surface, the second facing surface may comprise grooves extending radially outward of the nozzle body from the injection port, and the grooves may be formed at approximately equal intervals.

[13] In one or more embodiments, widths of the grooves may increase toward the center of the second facing surface.

[14] In one or more embodiments, the second facing surface may comprise a step formed in a circle outside the grooves, and a height of the second facing surface outside the circle may be higher than a height of the second facing surface inside the circle.

[15] In one or more embodiments, a thickness of the air gap is 1 mm or less.

[16] In one or more embodiments, the pressing device may further comprise a contact plate that contacts the DUT or the carrier, the heater unit may contact the contact plate, and the cold plate may contact the heater unit and press the heater unit toward the contact plate.

[17] In one or more embodiments, a sum of a thickness of the cold plate, a thickness of the heater unit, and a thickness of the contact plate may be 2 mm or less.

[18] An Electronic component testing apparatus according to one or more embodiments of the present invention is an electronic component testing apparatus testing the DUT. The electronic component testing apparatus comprise: the above electronic component handling apparatus; and a tester comprising a socket.

In the electronic component handling apparatus and the electronic component testing apparatus according to one or more embodiments of the present invention, the heater unit of the temperature control device comprises the flat heater. Since this flat heater has thin thickness, the heat capacity of the flat heater is reduced compared to the heat capacity of the ceramic heater as described above. Therefore, since the heating rate of the heater unit using the flat heater can be improved, the responsiveness can be improved.

Further, since the first and second heat transfer material is disposed on the first and second main surfaces of the flat heater, even when the flat heater generates heat rapidly, it is possible to dissipate heat from the flat heater by the first and second heat transfer material. Therefore, it is possible to prevent damage to the flat heater.

BRIEF DESCRIPTION OF DRAWINGS

FIG. 3 is a cross-sectional view illustrating a condition after the pusher of one or more embodiments sucks and holds the DUT.

DETAILED DESCRIPTION

Hereinafter, embodiments of the present invention will be described with reference to the drawings.

Figure 1:
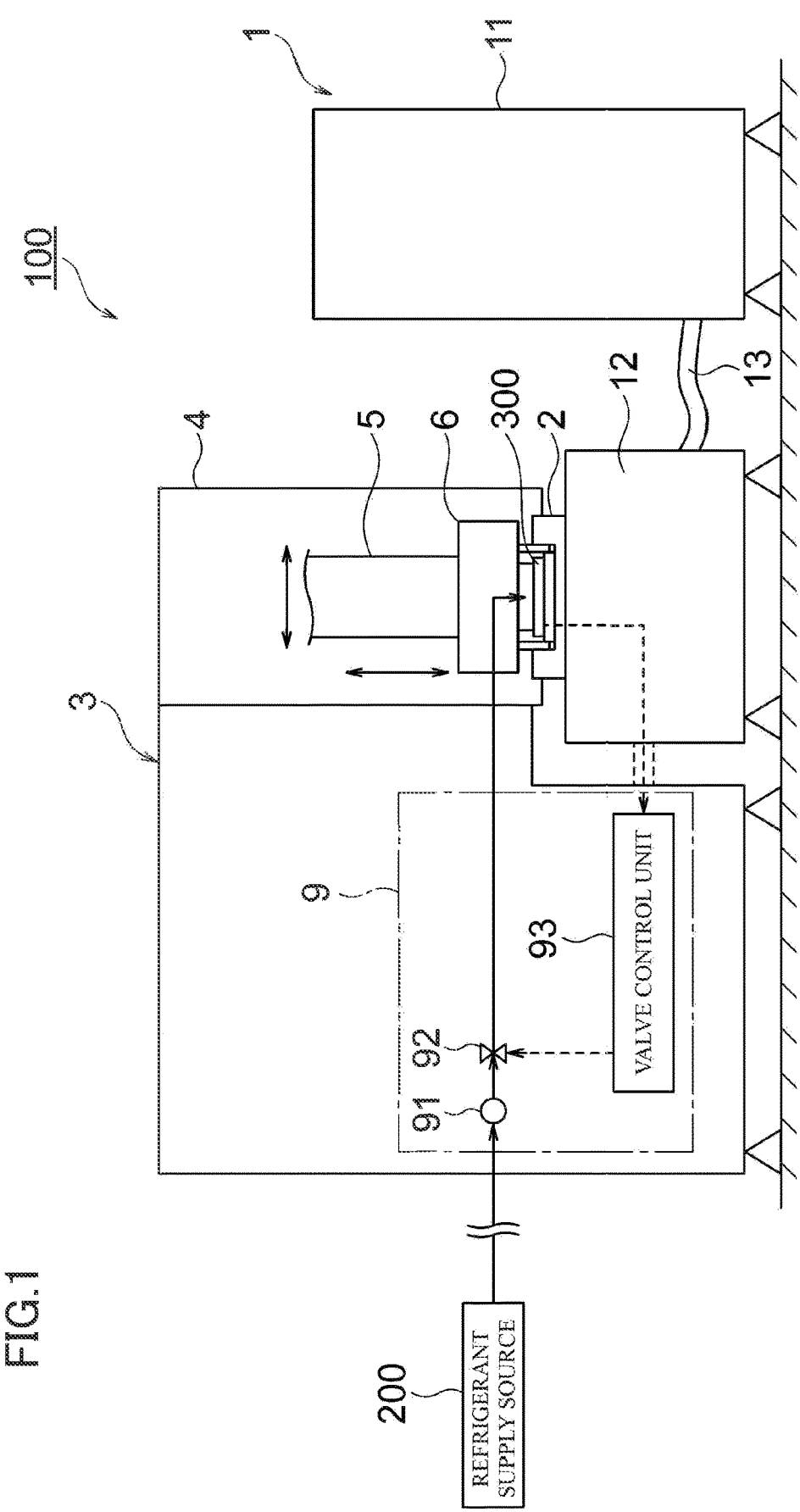
FIG. 1 is a block diagram illustrating an example of a configuration of the configuration of an electronic component testing apparatus according to one or more embodiments of the present invention.
Figure 2:
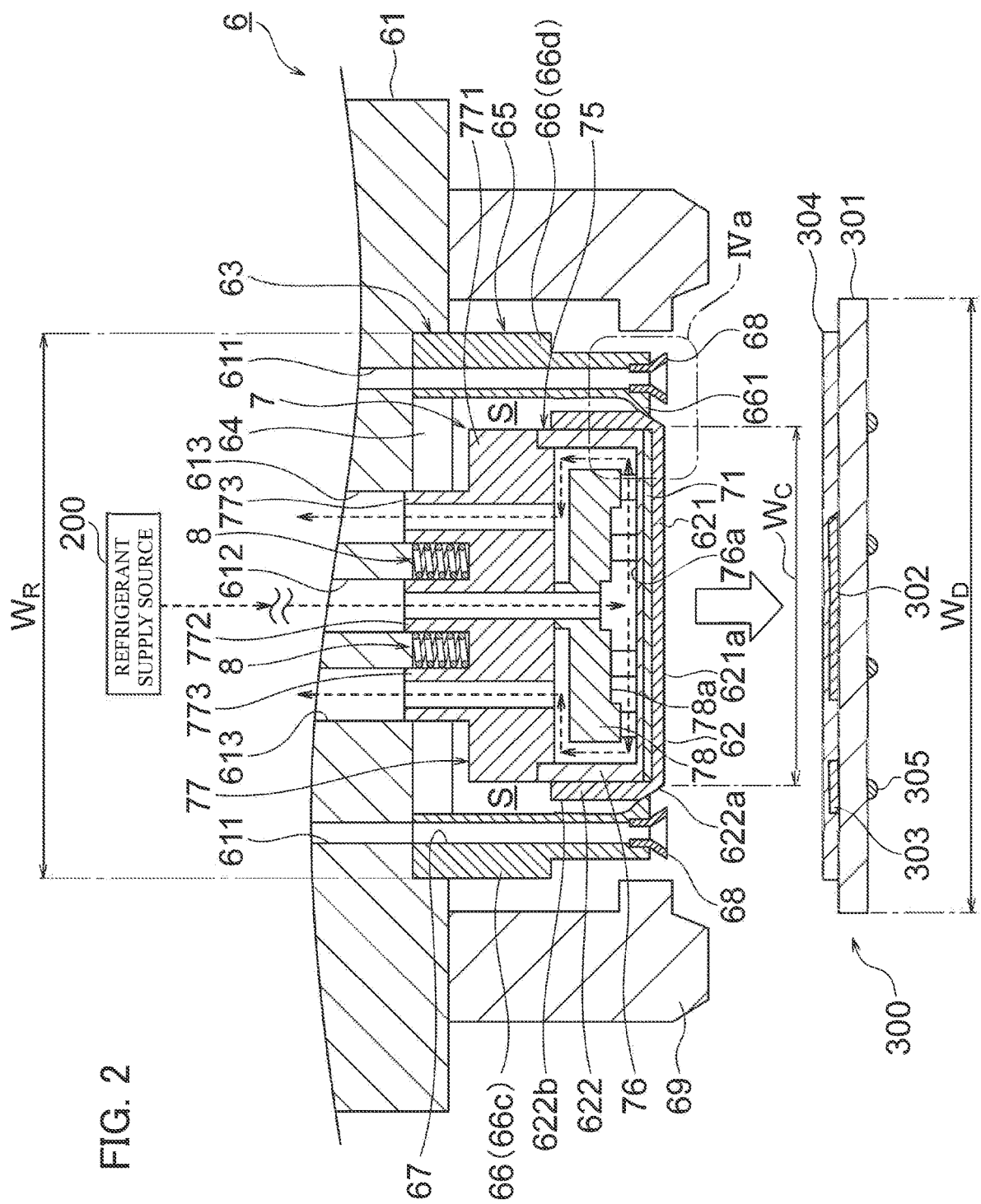
FIG. 2 is a cross-sectional view illustrating a condition before the pusher of one or more embodiments sucks and holds the DUT.
Figure 4A:
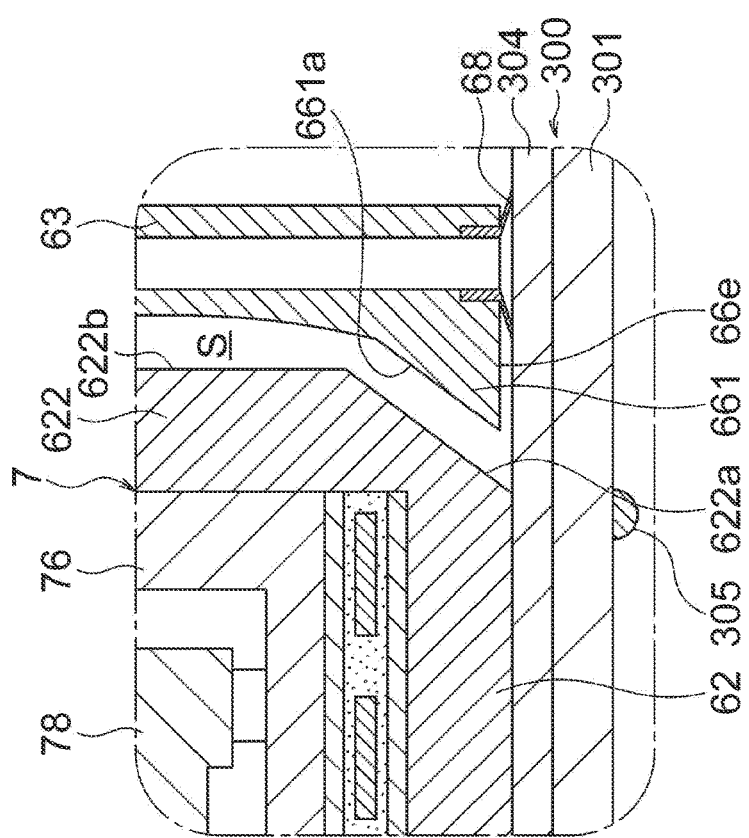
FIG. 4A is an enlarged sectional view of IVa portion of FIG. 2.
Figure 4B:
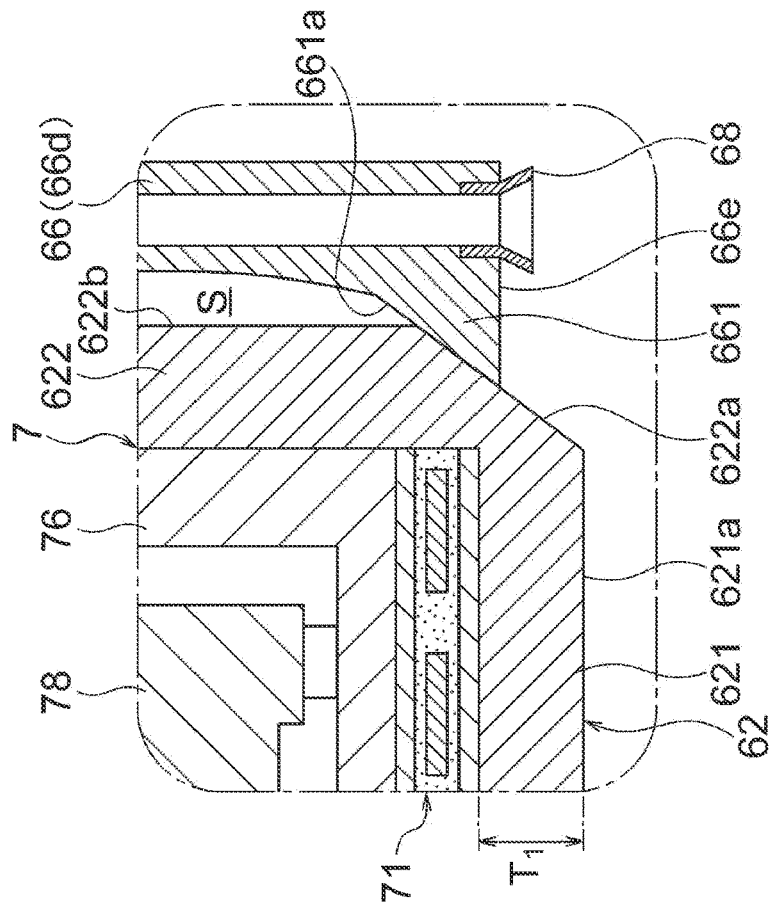
FIG. 4B is an enlarged sectional view of IVb portion of FIG. 3.
Figure 5:
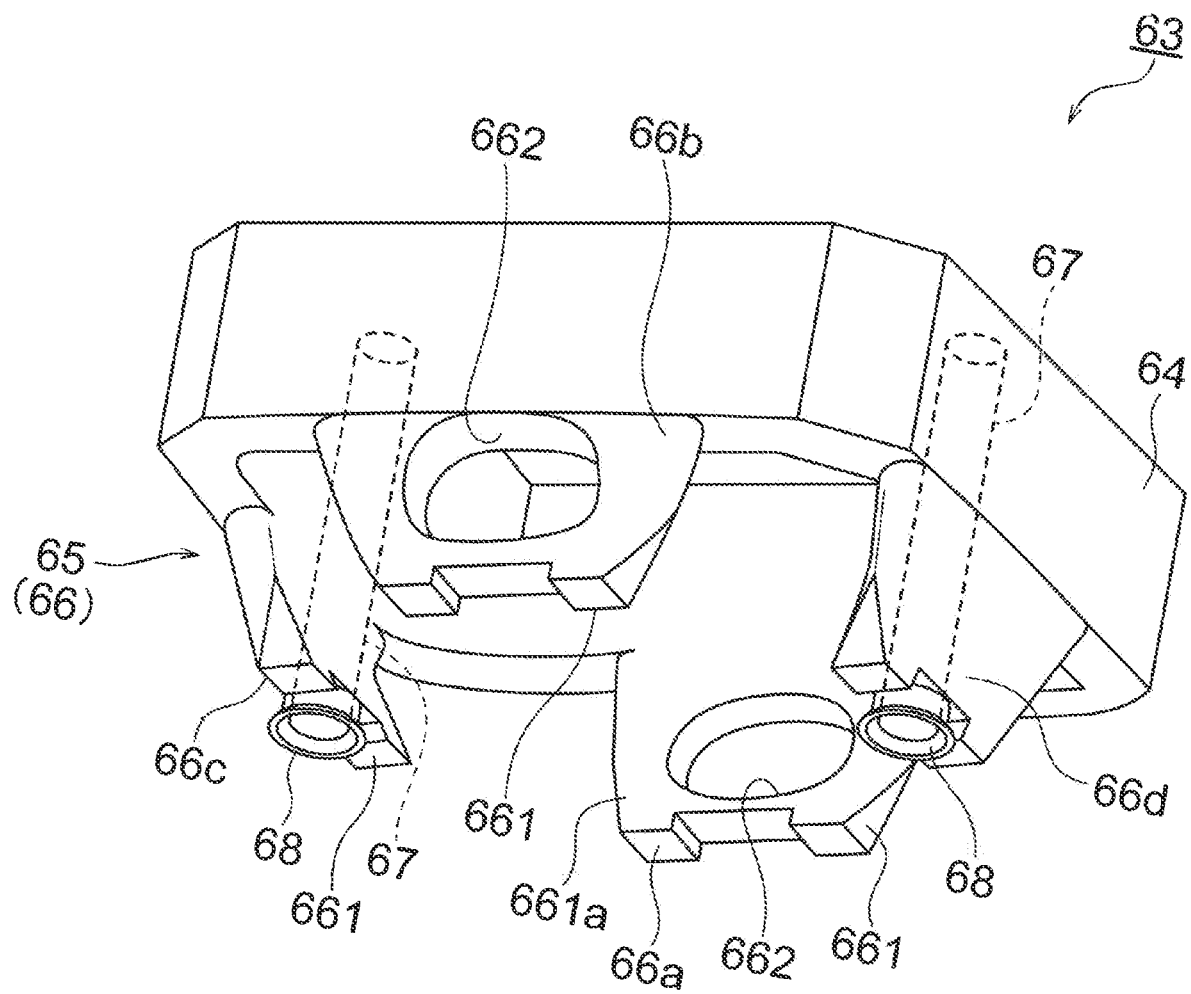
FIG. 5 is a perspective view from below illustrating a retainer in one or more embodiments.

FIG. 1 is a block diagram illustrating an example of a configuration of the configuration of an electronic component testing apparatus according to one or more embodiments. FIG. 2 is a cross-sectional view illustrating a condition before the pusher of one or more embodiments sucks and holds the DUT, and FIG. 3 is a cross-sectional view illustrating a condition after the pusher sucks and holds the DUT. FIG. 4A is an enlarged sectional view of IVa portion of FIG. 2, and FIG. 4B is an enlarged sectional view of IVb portion of FIG. 3. FIG. 5 is a perspective view from below illustrating a retainer in one or more embodiments.

An electronic component testing apparatus 100 in one or more embodiments shown in FIG. 1 is an apparatus for testing the electrical properties of the DUT 300. Specific examples of the DUT 300 to be tested may include SoC (System on a chip), logic-based devices, or memory-based devices. As shown in FIG. 2, the DUT 300 in one or more embodiments comprises a substrate 301, a IC chip 302, a temperature detecting circuit 303, a mold resin 304, and terminals 305.

In this DUT 300, the IC chip 302 and the temperature detection circuit 303 are mounted on the upper surface of the substrate 301, the IC chip 302 and the temperature detection circuit 303 are covered by the mold resin 304. Further, on the lower surface of the substrate 301, the terminals 305 which are electrically connected to the IC chip 302 and the temperature detecting circuit 303 are provided, these terminals 305 are electrically connected in contact with the socket 2 to be described later. In one or more embodiments, the above temperature detection circuit 303 is described as an electronic component separated from the IC chip 302, but is not limited thereto. The temperature detection circuit 303 may be included in the IC chip 302.

The electronic component testing apparatus 100, as shown in FIG. 1, comprises a tester 1 for testing the DUT 300, a socket 2 for electrically connecting the DUT 300 and the tester 1, and a handler 3 for transferring the DUT 300 and pressing the DUT 300 to the socket 2.

The tester 1 comprises a main frame 11 and a test head 12. The main frame 11 is connected to the test head 12 via a cable 13. The main frame 11 tests the DUT 300 by sending a test signal to the DUT 300 via the test head 12, and evaluates the DUT 300 according to a test result. The test head 12 is connected to the main frame 11 via the cable 13, when the DUT 300 is tested, and sends a test signal from the main frame 11 to the DUT 300.

As shown in FIG. 3, the test head 12 is electrically connected to the DUT 300 via the socket 2. The socket 2 includes a socket body 21, and contactors 22. The socket body 21 is fixed to the upper surface of the test head 12. The contactors 22 are disposed in the socket body 21. Although not specifically shown, the contactors 22 are electrically connected to a load board or the like disposed on the upper surface of the test head 12 and also electrically connected to the DUT 300 by contacting the terminals 305 of the DUT 300. In one or more embodiments, although using pogo pins as the contactors 22, it may be used other than the pogo pins as the contactors 22. For example, cantilever type probe needles, an anisotropic conductive rubber sheet, or a membrane type contactor having bumps formed on the insulating film may be used.

As shown in FIG. 1, the DUT 300 is pressed against the socket 2 by the handler 3. The handler 3 includes a thermostatic chamber 4, a contact arm 5, a pusher 6, and a refrigerant supply unit 9. Incidentally, the handler 3 in one or more embodiments corresponds to an example of an "electronic component handling apparatus," the pusher 6 in one or more embodiments corresponds to an example of a "pressing device."

The thermostatic chamber 4 is capable of adjusting the temperature of the ambient inside to a desired temperature, it is possible to apply a temperature of high or low temperature to DUT 300. The thermostatic chamber 4 is not particularly limited, for example, it is possible to adjust the temperature in the range of −55° C. to +155° C. The thermostatic chamber 4 houses a contact arm 5, a pusher 6. Furthermore, the thermostatic chamber 4 houses the socket 2 through an opening formed in the bottom of the thermostatic chamber 4. Incidentally, the handler 3 may not be comprise a thermostatic chamber 4.

The contact arm 5 is supported on a rail (not shown) provided with the handler 3. The contact arm 5 includes an actuator for horizontal movement (not shown) and can move back and forth and left and right according to the rail. Further, the contact arm 5 includes an actuator for vertical drive (not shown) and can move in the vertical direction.

In the lower end of the contact arm 5, the pusher 6 is disposed. As shown in FIG. 2, the pusher 6 includes a pusher body 61, a contact plate 62, a retainer 63, a suction pad 68, a vertical guide 69, a temperature control device 7, and a biasing mechanism 8.

As shown in FIG. 2, the pusher body 61 in one or more embodiments includes a plurality (two in this example) of first suction holes 611, a first refrigerant supply hole 612, a plurality (two in this example) of first refrigerant collect holes 613. The first suction hole 611 is a through hole which opens at the lower surface of the pusher body 61, the opening is connected to the second suction hole 67 (described later) of the retainer 63. The first suction hole 611 is connected to a vacuum pump (not shown), the inside of the first suction hole 611 has a negative pressure by the vacuum pump.

The first refrigerant supply hole 612 is also a through hole which opens at the lower surface of the pusher body 61, a supply-side tubular portion 772 (described later) of the refrigerant guide 77 (described later) is inserted to the first refrigerant supply hole 612. In the first refrigerant supply hole 612, the refrigerant is supplied from the refrigerant supply source 200 provided outside the handler 3. Further, the first refrigerant collect hole 613 is also a through hole which opens at the lower surface of the pusher body 61, the collect-side tubular portion 773 (described later) of the refrigerant guide 77 (described later) is inserted to the first refrigerant collect hole 613. In the first refrigerant collect hole 613, the refrigerant after being utilized in the temperature control device 7 is recovered. Incidentally, the first suction holes 611 described above, the first refrigerant supply holes 612, and the first refrigerant collect holes 613 may be provided in portions other than the pusher body 61.

As shown in FIG. 2, the contact plate 62 is a plate having a convex shape that is bent so as to protrude downward. As shown in FIG. 3, the contact plate 62 is a member in direct contact with the DUT 300 while the pusher 6 holds the DUT 300. Further, through the contact plate 62, the temperature control device 7 heats or cools the DUT 300.

As a material constituting the contact plate 62, a metal having an insulating coating formed on a surface of the metal or the like can be used. Specifically, for example, it is possible to use aluminum having an anodic oxide film on the surface. In order to transfer heat from the temperature control device 7 to the DUT 300, the contact plate 62 may be made of a highly thermally conductive metallic material. Further, by using a metal having the insulating film formed on the surface, it is possible to shield the electromagnetic noise generated from the pusher 6 against the DUT 300, and it is possible to electrically insulate the pusher 6 from the DUT 300. Incidentally, in order to prevent electrostatic discharging (ESD), although not shown in particular, the contact plate 62 may be electrically connected to ground.

The contact plate 62 has a contact portion 621 and a side portion 622. The contact portion 621 extends along a direction substantially parallel to the DUT 300. The contact portion 621 has a contact surface 621a that contacts the DUT 300. The contact surface 621a in one or more embodiments is the lower surface of the contact portion 621, as shown in FIG. 3, when the pusher 6 holds the DUT 300, the contact surface 621a presses in contact with the DUT 300. Further, the above temperature control device 7 applies heat to the DUT 300 through the contact surface 621a. As illustrated in FIG. 4A, thickness $T_1$ of the contact portion 621 may be, but is not limited to, 500 μm to 550 μm (500 μm≤$T_1$≤550 μm).

As shown in FIG. 2, the width $W_C$ of the contact surface 621a is smaller than the width $W_D$ of the DUT 300 as shown in the following inequality (1), and is smaller than the width $W_R$ of the retainer 63 as shown in the following inequality (2). Thus, by the width of the contact surface 621a of the contact plate 62 is small, it is possible to reduce the heat capacity of the contact portion 621, it is possible to improve the rate of temperature change of the contact portion 621 by the temperature control device 7 during the temperature control of the DUT 300. That is, it is possible to improve the responsiveness of the temperature adjustment by the pusher 6.

$$W_D > W_C \tag{1}$$

$$W_R > W_C \tag{2}$$

In the above inequality (1), $W_D$ is the width of the DUT 300, $W_C$ is the width of the contact surface 621a of the contact plate 62, in the above inequality (2), $W_R$ is the width of the retainer 63.

The side portion 622 of the contact plate 62 is connected to the outer peripheral end of the contact portion 621 and extends along a direction substantially perpendicular to the contact portion 621. The side portion 622 has a locking surface 622a, and a side surface 622b. The locking surface 622a in one or more embodiments is the lower surface of the side portion 622. The locking surface 622a is an inclined surface having an annular shape surrounding the contact surface 621a, and is inclined so that the width of the contact plate 62 increases with increasing the distance from the contact surface 621a. As shown in FIGS. 2 and 4A, the locking surface 622a is a surface in contact with the retainer 63. Further, the side surface 622b is a side surface connected to the upper end of the locking surface 622a, and extends along a direction substantially perpendicular to the contact portion 621. This side surface 622b is constantly isolated from the retainer 63.

The retainer 63 is a member for holding the contact plate 62. The retainer 63, as shown in FIG. 2, is disposed on the lower surface of the pusher body 61. As shown in FIGS. 2 and 5, the retainer 63 in one or more embodiments has an annular shape, and surrounds the contact plate 62. Further, as shown in FIG. 2, the retainer 63 is separated from the temperature control device 7, the space S is formed between the retainer 63 and the temperature control device 7. Since the heat generated from the temperature control device 7 is hardly transmitted to the retainer 63 by this space S, it is possible to efficiently perform the temperature adjustment of the DUT 300.

As shown in FIG. 5, the retainer 63 includes a frame-shaped portion 64, a holding portion 65, and second suction holes 67. The frame-shaped portion 64 has an annular shape. As shown in FIG. 2, the frame-shaped portion 64 is fixed to the lower surface of the pusher body 61. Although not particularly limited, the frame-shaped portion 64 can be fixed to the pusher body 61 by fasteners such as bolts.

As shown in FIGS. 2 and 5, in the lower surface of the frame-shaped portion 64, the holding portion 65 for holding in contact with the contact plate 62 is formed. The holding portion 65 according to one or more embodiments includes a plurality (four in this example) of claw portions 66a~66d (hereinafter, collectively referred to as the claw portion 66).

The claw portion 66 protrudes downward from the lower surface of the frame-shaped portion 64. The claw portion 66 is disposed so as to surround the four sides of the contact plate 62. In one or more embodiments, a pair of the claw portions 66a,66b are arranged so as to face each other, a pair of the claw portions 66c,66d are arranged so as to face each other.

Further, these claw portion 66a to 66d, together with being spaced apart from each other, surrounds the contact plate 62 along the annular locking surface 622a of the contact plate 62. Thus, it is possible to reduce the contact area between the holding portion 65 and the contact plate 62 by holding the contact plate 62 with the claw portions 66 which are arranged at intervals from each other, heat is hardly escaped from the contact plate 62 to the holding portion 65. Therefore, it is possible to efficiently adjust the temperature of the DUT 300.

Further, as shown in FIG. 5, the claw portion 66 has a protruding portion 661, and an opening 662. The protruding portion 661 of one or more embodiments, as shown in FIG. 4A, is disposed in the lower portion of the claw portion 66, protrudes toward the contact plate 62. The protruding portion 661 in one or more embodiments has a holding surface 661a. The holding surface 661a is opposed to the locking surface 622a of the contact plate 62 is an inclined surface substantially parallel to the locking surface 622a of the contact plate 62. The holding surface 661a holds the contact plate 62 by supporting the locking surface 622a from below when the contact plate 62 is not in contact with the DUT 300. At this time, the locking surface 622a of the contact plate 62 is not fixed to the holding surface 661a of the retainer 63 by an adhesive or a screw or the like, the contact plate 62 is detachably held in the retainer 63.

As shown in FIG. 5, the claw portion 66a,66b has an openings 662. The openings 662 penetrates the claw portion 66a,66b horizontal direction. By the openings 662, heat is hardly escaped from the contact plate 62 to the claw portion 66a,66b and reduce the weight of the retainer 63.

The second suction hole 67 penetrates the frame-shaped portion 64 and the claw portion 66c, 66d. The upper end of the second suction hole 67 is connected to the first suction hole 611 of the pusher body 61. Since the second suction hole 67 is connected to a vacuum pump (not shown) via the first suction hole 611, the inside of the second suction hole 67 has a negative pressure.

As shown in FIGS. 3 and 4B, the suction pads 68 are disposed at the lower end of the second suction holes 67. The suction pad 68 contacts to the DUT 300, the suction pad 68 forms a space surrounded by the suction pad 68 and the DUT 300. Since this space is connected to the second suction hole 67, in the lower end surface 66e of the claw portion 66c, 66d, it is possible to suck and hold the DUT 300.

As shown in FIG. 4B, while the suction pad 68 is sucking the DUT 300, the contact surface 621a of the contact plate 62 is in contact with the DUT 300. At this time, since the locking surface 622a of the contact plate 62 is not fixed to the holding surface 661a of the retainer 63, the contact plate 62 is pushed upward by the DUT 300, the contact plate 62 is separated from the retainer 63. Thus, by the contact plate 62 is separated from the retainer 63, It is possible to prevent heat from escaping to the retainer 63 when the temperature control device 7 controls the temperature of the DUT 300. That is, it is possible to reduce the heat capacity of the members interposed between the temperature control device 7 and the DUT 300, it is possible to improve the responsiveness of the temperature adjustment.

As shown in FIGS. 2 and 3, the temperature control device 7 is disposed inside the contact plate 62. The temperature control device 7 adjusts the temperature of the DUT 300 via the contact plate 62.

Figure 6:
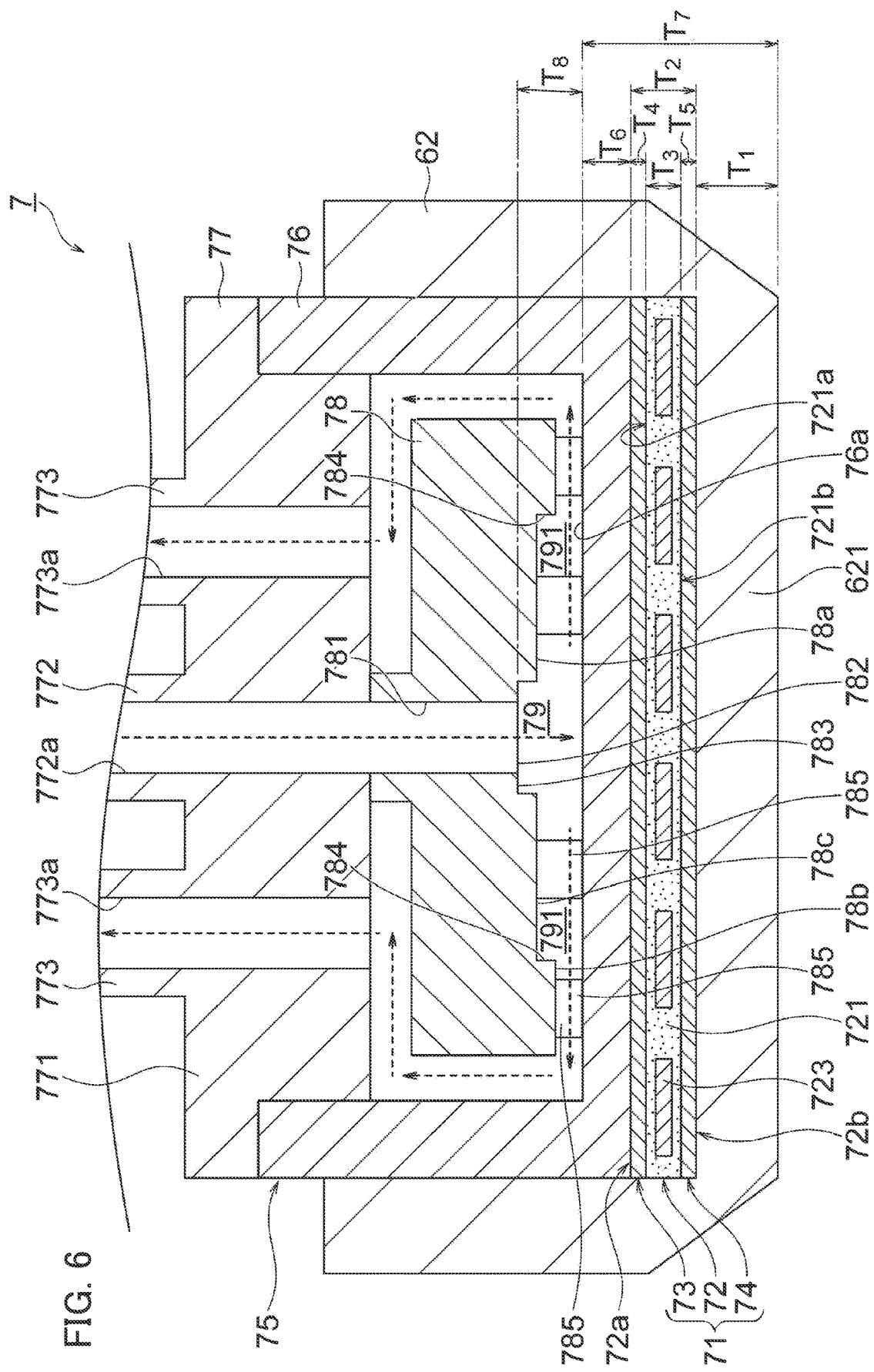
FIG. 6 is an enlarged cross-sectional view of a contact plate and a temperature control device in one or more embodiments.
Figure 7:
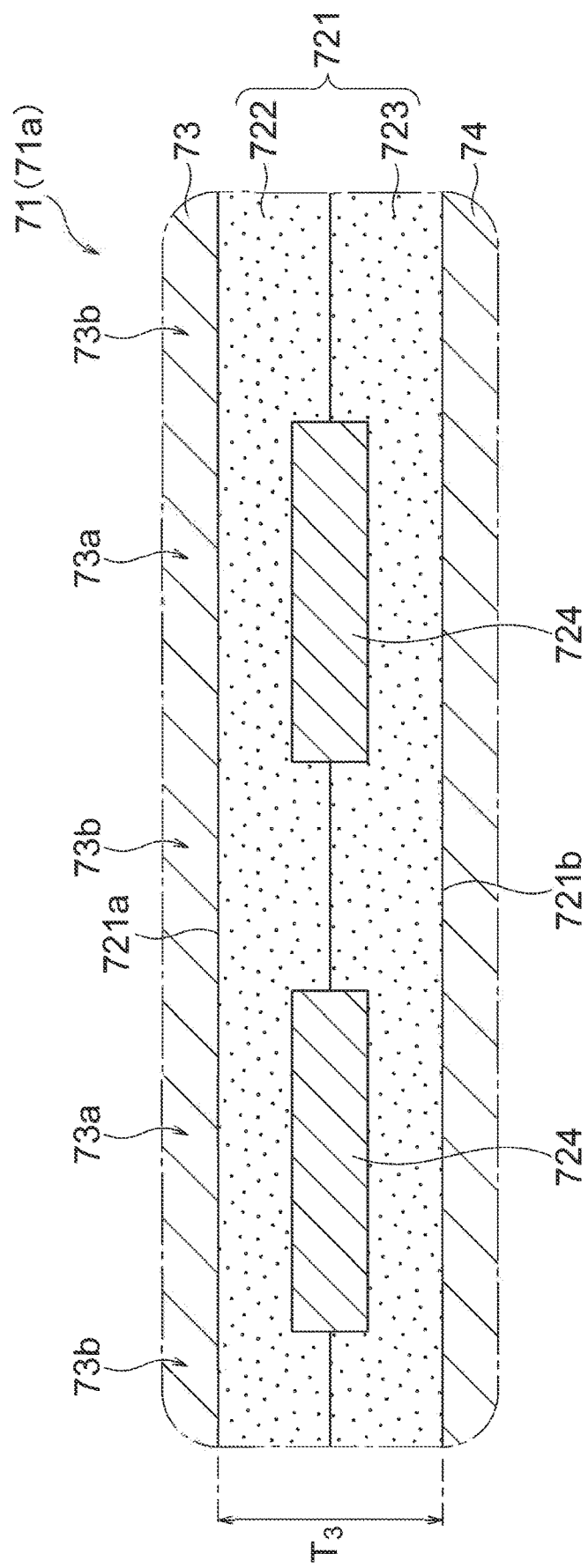
FIG. 7 is an enlarged cross-sectional view of VII portion of FIG. 6.
Figure 8:
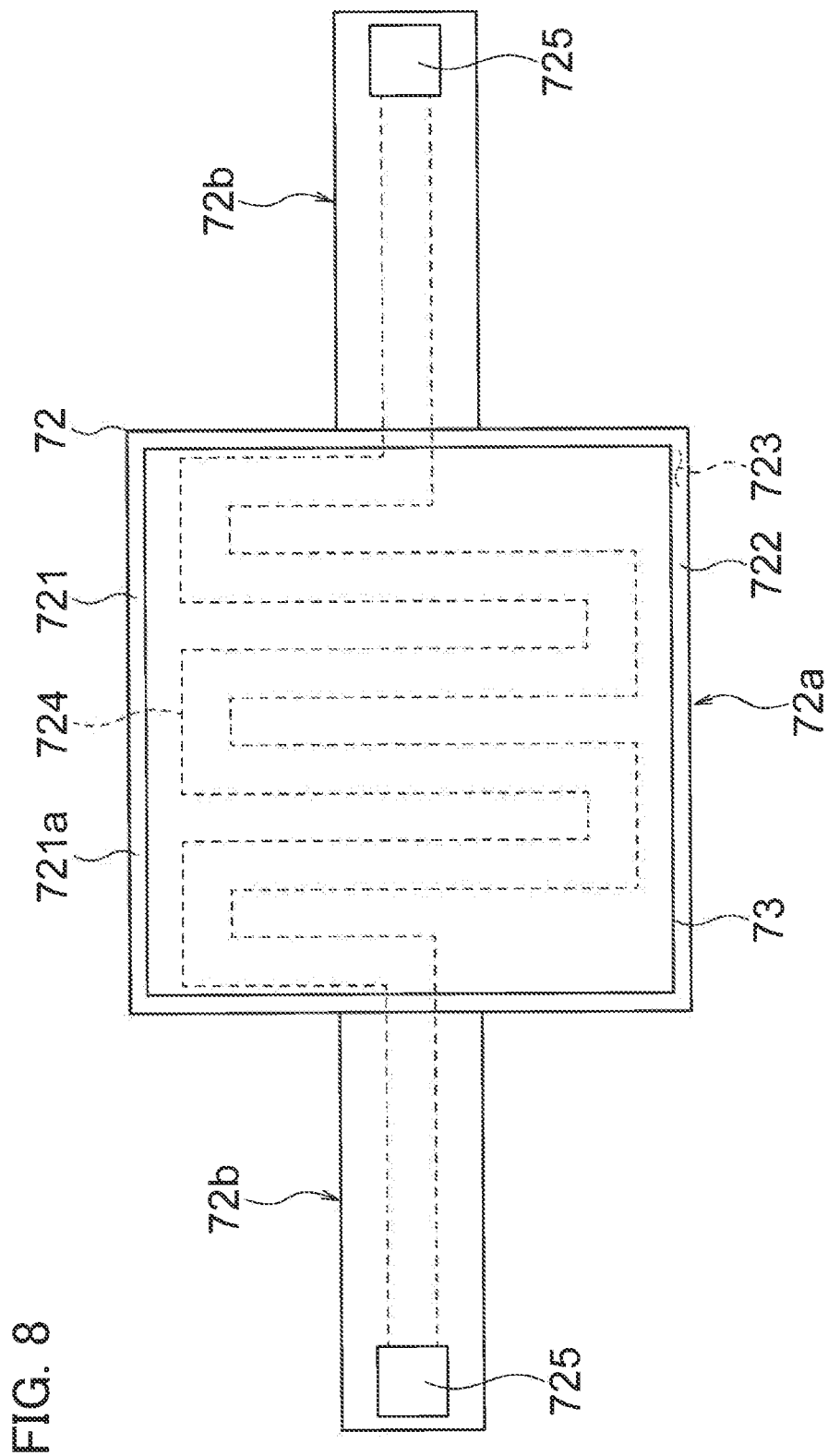
FIG. 8 is a plan view illustrating an example of a configuration of a heater unit of one or more embodiments.

FIG. 6 is an enlarged cross-sectional view of a contact plate and a temperature control device in one or more embodiments, FIG. 7 is an enlarged cross-sectional view of VII portion of FIG. 6. FIG. 8 is a plan view illustrating an example of a configuration of a heater unit of one or more embodiments. As shown in FIG. 6, the temperature control device 7 includes a heater unit 71 that is a heating source, and a cooling unit 75 that is a cooling source.

The heater unit 71 is disposed on the contact portion 621 of the contact plate 62. The heater unit 71 is a sheet-shaped laminate obtained by laminating a flat heater 72, a first heat transfer material 73, and a second heat transfer material 74. The thickness $T_2$ of the heater unit 71 is not particularly limited, but is 400 μm or less ($T_2 \leq 400$ μm).

As shown in FIGS. 6 to 8, the flat heater 72 has a planar shape (a sheet shape). Since such flat heater 72 has thin thickness, the heat capacity of the flat heater 72 is reduced as compared with the heat capacity of the ceramic heater or the like. Therefore, it is possible to improve the heating rate of the temperature control device 7, it is possible to improve the responsiveness.

As shown in FIG. 6, the thickness $T_3$ of such flat heaters 72 may be, but is not particularly limited to, 100 μm to 150 μm (100 μm $\leq T_3 \leq$ 150 μm). Further, as the flat heater 72, for example, it is possible to use a resin film heater such as a polyimide heater or a polyester heater. In particular, as the flat heater 72, a polyimide heater may be used. The polyimide heaters are excellent in heat resistance among heaters using resin. Furthermore, since the polyimide heater is inexpensive as compared with a ceramic heater or the like, it is possible to reduce the cost.

As shown in FIG. 8, the flat heater 72 has a heater portion 72a, and a lead portion 72b. The heater portion 72a is a portion for heating the contact plate 62. On the other hand, the lead portion 72b has a strip-shaped shape extending from the heater portion 72a, the lead portion 72b is used for connecting the power source for supplying power to the flat heater 72.

As shown in FIGS. 6 and 8, the flat heater 72 has a resin layer 721, a metal wire 724, and terminals 725 (see FIG. 8). The resin layer 721 is a planar layer. As shown in FIG. 7, the resin layer 721 includes a first resin layer 722 and a second resin layer 723 laminated to the first resin layer 722. The first resin layer 722 and the second resin layer 723 are not particularly limited, but are resin films and are bonded to each other via an adhesive (not shown) or the like. Incidentally, the first and second resin layers 722, 723 may be bonded without an adhesive. The first and second resin layers 722,723 are made of, for example, a resin material such as polyimide or polyester. In particular, from the view of heat resistance, polyimide may be used as the resin material.

The metal wire 724 is sandwiched between the first and second resin layers 722, 723. The metal wire 724, for example, is composed of a metal such as stainless steel. As shown in FIG. 8, the metal wire 724 meanders in the heater portion 72a and is connected to the terminals 725 at the lead portion 72b. This terminals 725 are electrically connected to the power supply described above.

As shown in FIGS. 6 to 8, the first heat transfer material 73 is disposed on a first main surface (an upper surface) 721a of the flat heater 72. The second heat transfer material 74 is disposed on a second main surface (a lower surface) 721b of the flat heater 72. These first and second heat transfer material 73, 74 is a heat transfer material for radiating heat generated in the flat heater 72 from the flat heater 72. The thickness $T_4$, $T_5$ of the first and second heat transfer materials 73 and 74 may be, but are not limited to, 50 μm to 100 μm (50 μm≤$T_4$≤100 μm, 50 μm≤$T_5$≤100 μm).

Since the metal wire in the flat heater generates heat, the temperature of the resin layer in the vicinity of the metal wiring becomes too high locally by locally temperature rise caused in the vicinity of the metal wiring, the resin layer may be burned. On the other hand, in the heater unit 71 in one or more embodiments, the local temperature rise in the vicinity of the metal wiring 724 is suppressed by diffusing heat to a portion other than the vicinity of the metal wiring 724 by the first and second heat transfer materials 73 and 74, it is possible to suppress the occurrence of burnout of the resin layer 721.

The first and second heat transfer material 73, 74, for example, TIM (Thermal Interface Material) can be used. As TIM, for example, a metal foil made of aluminum or copper, a graphite sheet, a silicone rubber sheet dispersion and held filler having a thermal conductivity, a sheet containing carbon nanotubes (CNT), and a gel in which a filler having a thermal conductivity is dispersed, or the like can be used.

The first and second heat transfer material 73 and 74 may preferentially diffuse heat from the flat heater 72 in a first direction (horizontal in this example) parallel to the first and second main surfaces 721a, 721b of the flat heater 72. Incidentally, the heat transfer material for preferentially diffusing the heat in the first direction is a heat transfer material whose thermal conductivity in the first direction is greater than the thermal conductivity in a direction perpendicular to the first direction in a state of being pressed at a predetermined pressure. As such a material, the graphite sheet described above, the sheet manufactured by bundling a CNT extending along a first direction, or the like can be used.

As shown in FIG. 7, since the metal wire 724 in the flat heater 72 generates heat, heat is easily concentrated in the first portions 73a of the first heat transfer material 73 located in the vicinity of the metal wire 724. On the other hand, in the second portions 73b of the first heat transfer material 73 away from the metal wire 724, relatively, heat is hardly concentrated. Therefore, as in one or more embodiments, by using the first heat transfer material 73 for preferentially diffusing heat in the first direction, it is possible to preferentially transfer heat toward the second portions 73b from the first portions 73a, and it is possible to restrain the first portion 73a is excessively heated. Therefore, it is possible to effectively prevent the portion in the vicinity of the metal wire 724 of the flat heater 72 from being locally heated to a high temperature. Further, for the same reason for the second heat transfer material 74, It is possible to effectively prevent the portion near the metal wiring 724 of the flat heater 72 from being locally heated to a high temperature.

As shown in FIGS. 2 and 6, the cooling unit 75 is disposed on the heater unit 71. The cooling unit 75 adjusts the temperature of the heater unit 71 to a desired temperature by cooling the heater unit 71 during generating heat. By the cooling unit 75, it is also possible to cool the DUT 300 through the heater unit 71 and the contact plate 62.

As shown in FIGS. 2 and 6, the cooling unit 75 includes a cold plate 76, a refrigerant guide 77, a nozzle body 78, and a flow path 79. The cold plate 76 is a bottomed cylindrical plate. The cold plate 76 is disposed on the heater unit 71, and is a member for cooling in contact with the heater unit 71. As the material constituting the cold plate 76, similarly to the contact plate 62 described above, it is possible to use a metal having the insulating film on the surface, or the like.

The thickness $T_6$ of the cold plate 76 is, for example, 300 μm to 400 μm (300 μm≤$T_6$≤400 μm). The sum Ty of the thickness $T_6$ of the cold plate 76, the thickness $T_2$ of the heater unit 71, and the thickness $T_1$ of the contact plate 62 is 2 mm or less ($T_6+T_2+T_1$≤2 mm). Since the distance between the cold plate 76 and the DUT 300 is short, it is possible to improve the responsiveness of the temperature adjustment.

Further, the cold plate 76 has a first facing surface 76a facing the nozzle body 78. The first facing surface 76a is a plane.

The refrigerant guide 77 is disposed so as to fit into the opening in the upper portion of the cold plate 76, the refrigerant guide 77 seals the inner space of the cold plate 76. As shown in FIG. 2, the refrigerant guide 77 is a member for guiding the refrigerant supplied from the first refrigerant supply hole 612 of the pusher main body 61 to the inside of the cooling unit 75 and guiding the refrigerant used for cooling to the first refrigerant collect hole 613 of the pusher body 61.

As shown in FIGS. 2 and 6, the refrigerant guide 77 includes a pressing portion 771, a supply-side tubular portion 772, and collect-side tubular portions 773. The pressing portion 771 is a body of the refrigerant guide 77, and presses the nozzle body 78 downward.

As shown in FIGS. 2 and 6, the supply-side tubular portion 772 is disposed substantially at the center of the upper surface of the pressing portion 771. As shown in FIG. 2, the supply-side tubular portion 772 is a cylindrical member extending upward from the upper surface of the pressing portion 771, and is inserted into the first refrigerant supply hole 612 of the pusher body 61. In the supply-side tubular portion 772, the second refrigerant supply hole 772a constituting a part of the flow path 79 is formed, the second refrigerant supply hole 772a extends to the lower surface of the pressing portion 771.

The collect-side tubular portions 773 are disposed on the upper surface of the pressing portion 771. As shown in FIG. 2, the collect-side tubular portion 773 is a cylindrical member extending upward from the upper surface of the pressing portion 771, and is inserted into the first refrigerant collect hole 613 of the pusher body 61. In the collect-side tubular portion 773, the second refrigerant collect hole 773a constituting a part of the flow path 79 is formed, the second refrigerant collect hole 773a extends to the lower surface of the pressing portion 771.

As shown in FIGS. 2 and 6, the nozzle body 78 is interposed between the cold plate 76 and the refrigerant guide 77. The nozzle body 78 is a member for injecting the refrigerant to the cold plate 76. As shown in FIG. 6, the nozzle body 78 has a through hole 781, an injection port 782, and a projection 785. The through hole 781 is connected to the second refrigerant supply hole 772a of the refrigerant guide 77. The through hole 781 constitutes a part of the flow path 79. The injection port 782 is formed at a substantially center of the lower end surface of the through hole 781 (a second facing surface 78a). The injection port 782 is separated from the cold plate 76, and injects the refrigerant supplied from the second refrigerant supply hole 772a of the refrigerant guide 77 toward the cold plate 76.

Further, the nozzle body 78 faces the first facing surface 76a of the cold plate 76, and has the second facing surface 78a separated from the first facing surface 76a. Therefore, the air gap 791 is formed between the first facing surface 76a and the second facing surface 78a. The air gap 791 also constitutes a part of the flow path 79, the refrigerant injected from the injection port 782 flows through the air gap 791 after arriving the first facing surface 76a of the cold plate 76. When the refrigerant flows in the air gap 791 on the cold plate 76, the refrigerant on the first facing surface 76a is accelerated, the cooling rate is improved. Therefore, it is possible to improve the responsiveness in temperature adjustment.

The refrigerant flowing through the air gap 791 is recovered in the second refrigerant collect hole 773a via the gap between the side surface of the nozzle body 78 and the cold plate 76, and the gap between the upper surface of the nozzle body 78 and the refrigerant guide 77.

Figure 9:
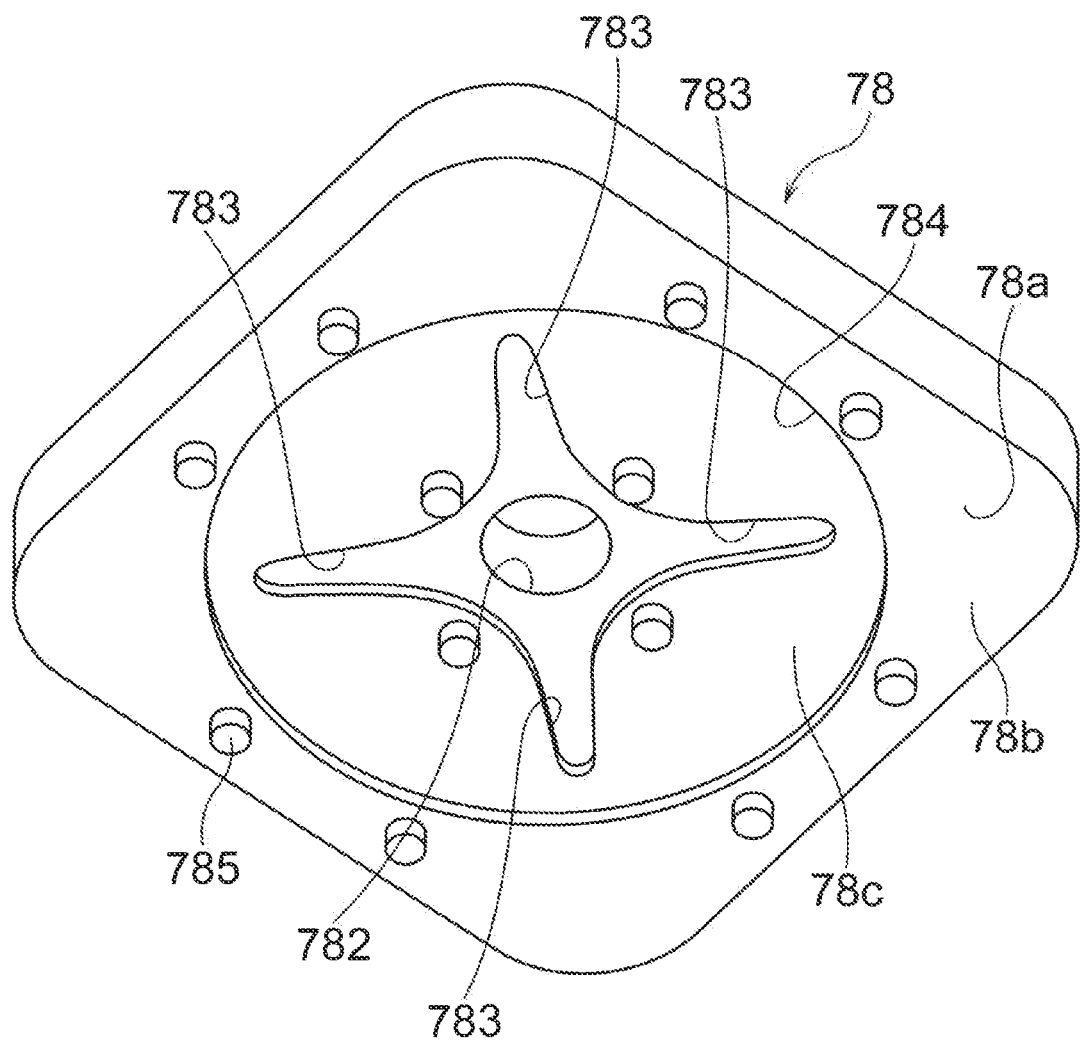
FIG. 9 is a perspective view from below illustrating a nozzle body in one or more embodiments.

FIG. 9 is a perspective view from below illustrating the nozzle body 78 in one or more embodiments. The second facing surface 78a is a plane. The second facing surface 78a includes a plurality (four in this example) of grooves 783, and a step 784. The grooves 783 extend radially outward of the nozzle body 78 from the injection port 782. The refrigerant injected from the injection port 782 can flow radially outward by being guided by the groove 783.

The widths of the grooves 783 are increase toward the center of the second facing surface 78a. Therefore, it is possible to flow the refrigerant at a high speed even at the tip of the groove 783.

Further, the grooves 783 are arranged at approximately equal intervals along the circumferential direction of the injection port 782 as the center. In the air gap 791, it is possible that the refrigerant evenly flows toward radially outward.

The step 784 is formed on the outside of the grooves 783. The step 784 has an annular shape. The second facing surface 78a is defined by the step 784, and includes an outer facing surface 78b located outside the step 784, and an inner facing surface 78c located inside the step 784. As shown in FIG. 6, the height $H_1$ of the outer facing surface 78b is higher than the height $H_2$ of the inner facing surface 78c. That is, the thickness of the air gap 791 is larger in the outer facing surface 78b, and is smaller in the inner facing surface 78c. By such a step 784, it is possible to accelerate the refrigerant in the outer peripheral portion of the second facing surface 78a.

Further, the thickness $T_8$ of the air gap 791 can be set as appropriate according to the pressure of the supplied refrigerant, for example, the thickness $T_8$ can be a 1 mm or less ($T_8 \leq 1$ mm). When the thickness $T_8$ of the air gap 791 is 1 mm or less, the refrigerant flowing through the air gap 791 can be accelerated, the cooling rate can be improve. Therefore, it is possible to improve the responsiveness in temperature adjustment.

As shown in FIGS. 6 and 9, the projections 785 are disposed on the second facing surface 78a. The projection 785 is a spacer interposed between the first facing surface 76a and the second facing surface 78a, and separates the first and second facing surfaces 76a, 78a. The distal end of the projection 785 is in contact with the first facing surface 76a of the cold plate 76, and defines the air gap 791 described above.

As shown in FIG. 2, the biasing mechanism 8 is interposed between the pusher body 61 and the refrigerant guide 77 of the temperature control device 7. The biasing mechanism 8 biases the cooling unit 75 toward the heater unit 71 by biasing the refrigerant guide 77 downward. The biasing mechanism 8 in one or more embodiments is a spring such as a coil spring. As the biasing mechanism 8, another elastic body such as rubber may be used. Further, the biasing mechanism 8 may constitute a part of the gimbal structure.

The cold plate 76 of the cooling unit 75 biased by the biasing mechanism 8 constantly presses the heater unit 71 toward the contact plate 62. Thus, since the first and second heat transfer material 73 and 74 are in close contact with the flat heater 72 by pressing the heater unit 71 toward the contact plate 62 with the cold plate 76, it is possible to promote heat dissipation to the first and second heat transfer materials 73 and 74 of the flat heater 72.

As shown in FIG. 2, the vertical guide 69 is disposed on the outside of the retainer 63. The vertical guide 69 is fixed to the lower surface of the pusher main body 61 extends downward from the lower surface of the pusher body 61. Although not particularly limited, the vertical guide 69 can be fixed to the pusher body 61 by fasteners such as bolts. As shown in FIG. 3, the vertical guide 69 can position the DUT 300 with respect to the pusher 6 in the vertical and horizontal directions by contacting with the DUT 300 when the pusher 6 sucks and holds the DUT 300.

As shown in FIG. 1, the refrigerant supply unit 9 supplies the refrigerant to the pusher 6. The refrigerant supply unit 9 includes a connecting portion 91, a valve 92, and a valve control unit 93. The connecting portion 91 is connected to the refrigerant supply source 200 disposed outside the electronic component testing apparatus 100. The refrigerant supplied by the refrigerant supply source 200 is a compressed dry air or a liquid nitrogen or the like. When the refrigerant supply source 200 supplies the compressed dry air, the refrigerant supply source 200 may comprise, for example, a compressor for taking in and compressing the outside air, and a dryer for drying the compressed air. Alternatively, the refrigerant supply source 200 may be an existing factory pipe or the like capable of supplying compressed dry air. When the refrigerant supply source 200 supplies the liquid nitrogen, the refrigerant supply source 200 may be, for example, a pressure vessel that stores the liquid nitrogen at a high pressure, or a factory pipe for liquid nitrogen supplying.

The valve 92 is disposed downstream of the connecting portion 91. The valve 92 adjusts the flow rate of the refrigerant supplied from the refrigerant supply source 200. As shown in FIG. 2, the refrigerant passing through the valve 92 is supplied to the first refrigerant supply hole 612 of the pusher body 61.

As shown in FIG. 1, the valve control unit 93 controls the opening and closing of the valve 92. The valve control unit 93 in one or more embodiments is inputted a detected value of the temperature detecting circuit 303 of the DUT 300 (refer to FIG. 2). The valve control unit 93 performs PID control on the basis of the detected value inputted so that the temperature of the DUT 300 becomes a desired value. The control method of the valve control unit 93 is not limited to PID control, other control methods may be used.

According to the electronic component testing apparatus 100 in the embodiments described above, the heater unit 71 of the temperature control device 7 has a flat heater 72. Since the flat heater 72 is thin thickness, the heat capacity of the flat heater 72 is reduced as compared with the heat capacity of the ceramic heater. Therefore, since the heating rate of the heater unit 71 can be improved, it is possible to improve the responsiveness.

Further, in the electronic component testing apparatus 100 in one or more embodiments, the first and second heat transfer materials 73 and 74 are disposed on the first and second main surfaces 721*a*, 721*b* of the flat heater 72. Therefore, even when the flat heater 72 generates heat rapidly, the first and second heat transfer materials 73 and 74 can suppress that the flat heater 72 becomes locally high temperature, can remove heat from the flat heater 72. Therefore, it is possible to prevent damage to the flat heater 72.

Further, in the electronic component testing apparatus 100 in one or more embodiments, since the ceramic heater which tends to be a high weight is not used, it is also possible to reduce the weight of the pusher 6.

Embodiments heretofore explained are described to facilitate understanding of the present invention and are not described to limit the present invention. It is therefore intended that the elements disclosed in the above embodiments include all design changes and equivalents to fall within the technical scope of the present invention.

For example, in the above embodiments, the pusher 6 sucks and holds the DUT 300, but is not limited thereto. The pusher 6 may suck and hold a carrier accommodating the DUT. Such a carrier is not particularly limited, and for example, the carriers described in JP 2019-197012 A and JP 2013-79860 A can be used.

Further, the pusher 6 may press the DUT 300 mounted on a test tray on which a plurality of DUTs 300 are mounted. In this case, the handler 3 includes a plurality of pushers 6, a plurality of pushers 6 press a plurality of the DUT 300 mounted on the test tray, respectively. In this case, all of the pushers 6 may have a configuration as in the embodiments described above.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

EXPLANATIONS OF LETTERS OR NUMERALS

100 . . . Electronic component testing apparatus
1 . . . Tester
11 . . . Main frame
12 . . . Test head
13 . . . Cable
2 . . . Socket
21 . . . Socket body
22 . . . Contactors
3 . . . Handler
4 . . . Thermostatic chamber
5 . . . Contact arm
6 . . . Pusher
61 . . . Pusher body
611 . . . First suction hole
612 . . . First refrigerant supply hole
613 . . . First refrigerant collect hole
62 . . . Contact plate
621 . . . Contact portion
621*a* . . . Contact surface
622 . . . Side portion
622*a* . . . Locking surface
622*b* . . . Side Surface
63 . . . Retainer
64 . . . Frame-shaped portion
65 . . . Holding portion
66 (66*a*~66*d*) . . . Claw portion
66*e* . . . lower end face
661 . . . Protruding portion
661*a* . . . Holding surface
662 . . . Opening
67 . . . Second suction hole
68 . . . Suction pad
69 . . . Vertical guide
7 . . . Temperature adjusting apparatus
71 . . . Heater unit
72 . . . Flat heater
72*a* . . . heater portion
72*b* . . . Lead portion
721 . . . Resin layer
721*a*,721*b* . . . first and second main surfaces
722,723 . . . First and second resin layers
724 . . . Metal wire
725 . . . Terminals
73 . . . First heat transfer material
73*a*,73*b* . . . First and second portions
74 . . . Second heat transfer material
75 . . . Cooling unit
76 . . . Cold plate
76*a* . . . First facing surface
77 . . . Refrigerant guide
771 . . . Pressing portion
772 . . . Supply-side tubular portion
772*a* . . . Second refrigerant supply hole
773 . . . Collect-side tubular portion
773*a* . . . Second refrigerant collect hole
78 . . . Nozzle body
78*a* . . . Second facing surface
78*b* . . . Outer facing surface
78*c* . . . Inner facing surface
781 . . . Through hole
782 . . . Injection port
783 . . . Grooves
784 . . . Step
785 . . . Projection
79 . . . Flow path
791 . . . Air gap
8 . . . Biasing mechanisms
9 . . . Refrigerant supply unit
91 . . . Connection portion
92 . . . Valve
93 . . . Valve control section
200 . . . Refrigerant supply source
300 . . . DUT
301 . . . Substrate.
302 . . . IC chip
303 . . . Temperature detecting Circuit
304 . . . Mold resin
305 . . . Terminals

What is claimed is:

1. A temperature control device that controls a temperature of a DUT, comprising:
a heater unit that is a heat source; and
a cooling unit that is a cooling source and contacts the heater unit, wherein the heater unit comprises:
a flat heater;
a first heat transfer material disposed on a first main surface of the flat heater; and
a second heat transfer material disposed on a second main surface of the flat heater, the cooling unit comprises:
a flow path in which a refrigerant flows;
a nozzle body that has an injection port injecting the refrigerant; and
a cold plate that faces the injection port and is separated from the injection port, wherein the refrigerant is injected from the nozzle body to the cold plate,
the flow path has an air gap formed between the nozzle body and the cold plate,
the refrigerant injected from the nozzle body flows in the air gap after arriving the cold plate, and
the cold plate directly contacts the refrigerant injected from the nozzle body.

2. The temperature control device according to claim 1, wherein the first and second heat transfer material preferentially diffuse heat from the flat heater in a first direction parallel to the first and second main surfaces of the flat heater.

3. The temperature control device according to claim 2, wherein the first and second heat transfer material are graphite sheets.

4. The temperature control device according to claim 1, wherein the heater unit is a sheet-like laminate having a thickness of 400 μm or less.

5. The temperature control device according to claim 1, wherein
the flat heater comprises:
a first resin layer;
a second resin layer laminated on the first resin layer; and
a metal wire layer sandwiched between the first and second resin layers.

6. The temperature control device according to claim 5, wherein the flat heater is a polyimide heater.

7. An electronic component handling apparatus that handles a DUT or a carrier accommodating the DUT, comprising:
a pressing device that:
electrically connects the DUT to a socket by pressing the DUT or the carrier toward the socket, and
the temperature control device according to claim 1, wherein
the pressing device further comprises:
an elastic body that biases the cooling unit toward the heater unit, and the cooling unit presses the heater unit by being biased by the elastic body.

8. The electronic component handling apparatus according to claim 7, wherein
the pressing device further comprises:
a contact plate that contacts the DUT or the carrier,
the cooling unit presses the heater unit by being biased by the elastic body, and
the heater unit contacts the contact plate by being pressed with the cooling unit.

9. The temperature control device according to claim 1, wherein
the cold plate comprises:
a first facing surface that faces the nozzle body,
the nozzle body comprises:
a second facing surface that faces the cold plate,
the air gap is formed between the first facing surface and the second facing surface, and
the first and second facing surfaces are flat surfaces.

10. The temperature control device according to claim 9, wherein
the injection port is formed substantially at a center of the second facing surface,
the second facing surface has grooves extending radially outward from the injection port, and
the grooves are formed at approximately equal intervals.

11. The temperature control device according to claim 10, wherein a width of each of the grooves increases toward the center of the second facing surface.

12. The temperature control device according to claim 10, wherein
the second facing surface has a step formed in a circle outside the grooves, and
a height of the second facing surface outside the circle is higher than a height of the second facing surface inside the circle.

13. The temperature control device according to claim 1, wherein a thickness of the air gap is 1 mm or less.

14. An electronic component handling apparatus that handles a DUT or a carrier accommodating the DUT, comprising:
a pressing device that:
electrically connects the DUT to a socket by pressing the DUT or the carrier toward the socket, and
the temperature control device according to claim 1, wherein
the pressing device further comprises:
a contact plate that contacts the DUT or the carrier,
the heater unit contacts the contact plate, and
the cold plate contacts the heater unit and presses the heater unit toward the contact plate.

15. The electronic component handling apparatus according to claim 14, wherein a sum of a thickness of the cold plate, a thickness of the heater unit, and a thickness of the contact plate is 2 mm or less.

16. An electronic component testing apparatus testing the DUT, comprising:
the electronic component handling apparatus according to claim 14; and
a tester that comprises a socket.

* * * * *